(12) United States Patent
Krassnitzer et al.

(10) Patent No.: US 10,032,610 B2
(45) Date of Patent: Jul. 24, 2018

(54) PLASMA SOURCE

(71) Applicant: Oerlikon Surface Solutions AG, Trubbach, Trubbach (CH)

(72) Inventors: Siegfried Krassnitzer, Feldkirch (AT); Juerg Hagmann, Sax (CH)

(73) Assignee: OBERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 0 days.

(21) Appl. No.: 14/651,278

(22) PCT Filed: Dec. 9, 2013

(86) PCT No.: PCT/EP2013/003704
§ 371 (c)(1),
(2) Date: Jun. 11, 2015

(87) PCT Pub. No.: WO2014/090389
PCT Pub. Date: Jun. 19, 2014

(65) Prior Publication Data
US 2015/0318151 A1    Nov. 5, 2015

(30) Foreign Application Priority Data

Dec. 13, 2012  (DE) .................. 10 2012 024 340

(51) Int. Cl.
| | |
|---|---|
| *C23C 16/50* | (2006.01) |
| *H01J 37/32* | (2006.01) |
| *H05H 1/50* | (2006.01) |

(52) U.S. Cl.
CPC .......... *H01J 37/3233* (2013.01); *C23C 16/50* (2013.01); *H01J 37/3244* (2013.01);
(Continued)

(58) Field of Classification Search
CPC ........ C23C 16/50; C23C 16/503; H01J 3/024; H01J 19/04–19/22; H01J 37/075;
(Continued)

(56) References Cited

U.S. PATENT DOCUMENTS

| | | | |
|---|---|---|---|
| 4,339,691 A | | 7/1982 | Morimiya |
| 4,769,101 A | * | 9/1988 | dos Santos Pereiro Ribeiro ...... H01J 37/32055 118/50.1 |

(Continued)

FOREIGN PATENT DOCUMENTS

| | | |
|---|---|---|
| EP | 1 162 647 B1 | 12/2001 |
| JP | 01-252781 A | 10/1989 |

(Continued)

OTHER PUBLICATIONS

International Search Report for PCT/EP2013/003704 dated Feb. 28, 2014.

*Primary Examiner* — Benjamin Kendall
(74) *Attorney, Agent, or Firm* — Pearne & Gordon LLP

(57) ABSTRACT

A plasma generating device includes a plasma source having a plasma source hollow body (1) and an electron emission unit (5) for emitting free electrons into the plasma source hollow body. The plasma source hollow body (1) has a first gas inlet (7*a*) and a plasma source opening (10) which forms an opening to a vacuum chamber. An anode has an anode hollow body (2). The anode hollow body (2) has a second gas inlet (7*b*) and an anode opening (11) which forms an opening to the vacuum chamber, and a voltage source (8) the negative pole of which is connected to the electron emission unit (5) and the positive pole of which is connected to the anode hollow body (2). The positive pole of the voltage source (8) is electrically connected by a first shunt (6*a*) to the plasma source hollow body.

19 Claims, 5 Drawing Sheets

Figure 1:
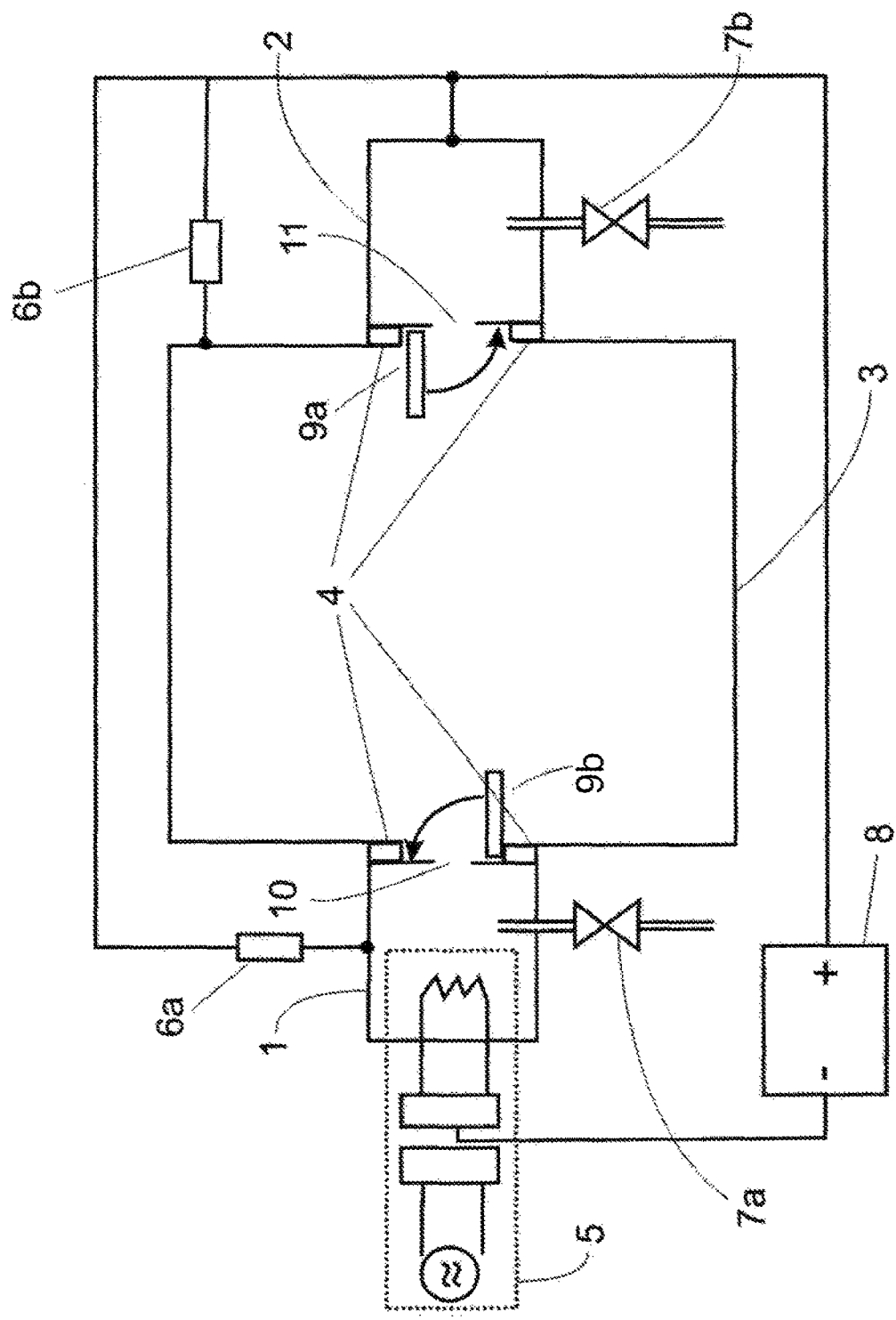

(52) U.S. Cl.
CPC ......... *H01J 37/32596* (2013.01); *H05H 1/50* (2013.01); *H01J 2237/3321* (2013.01)

(58) Field of Classification Search
CPC ...... H01J 37/32018–37/32073; H01J 37/3233; H01J 37/3244; H01J 37/32449; H01J 37/32513; H01J 37/32568; H01J 37/32596; H01J 2201/19–2201/196; H01J 2237/06308; H01J 2237/06375; H01J 2237/0822–2237/0827; H01J 2237/3321; H05H 1/50; H05H 2001/4695; H05H 2001/4697
See application file for complete search history.

(56) References Cited

U.S. PATENT DOCUMENTS

| | | | |
|---|---|---|---|
| 5,358,596 A | 10/1994 | Cappelli | |
| 5,404,017 A * | 4/1995 | Inuishi | H01J 27/08 250/454.11 |
| 5,616,373 A * | 4/1997 | Karner | C23C 16/272 427/122 |
| 6,262,539 B1 * | 7/2001 | Shi | H01J 37/32055 204/192.38 |
| 6,703,081 B2 * | 3/2004 | Karner | C23C 16/513 204/192.38 |
| 2004/0018320 A1 * | 1/2004 | Nicolussi | H01J 37/32009 427/535 |
| 2007/0026160 A1 | 2/2007 | Strikovski | |
| 2010/0230276 A1 * | 9/2010 | Beilis | H01J 27/08 204/192.38 |
| 2013/0098872 A1 * | 4/2013 | Dorf | H01J 37/3233 216/67 |
| 2013/0133690 A1 * | 5/2013 | Hirota | H01J 37/32403 134/1.1 |

FOREIGN PATENT DOCUMENTS

| | | |
|---|---|---|
| JP | 08-037099 A | 2/1996 |
| JP | 2008-231456 A | 10/2008 |
| RU | 2116707 C1 * | 7/1998 |
| WO | 2009/004762 A1 | 1/2009 |

* cited by examiner

Figure 3a
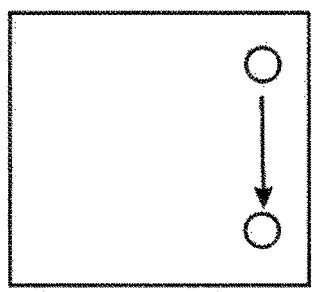
Figure 3b
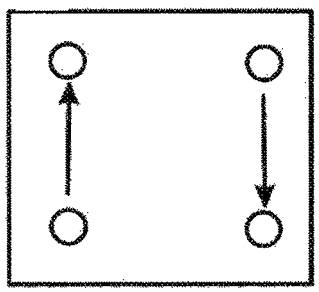
Figure 3c
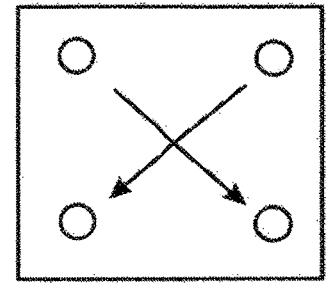
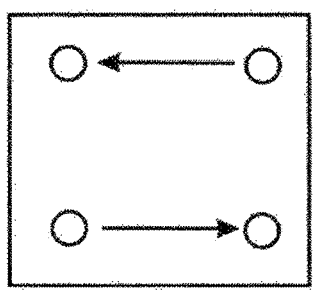
Figure 3d
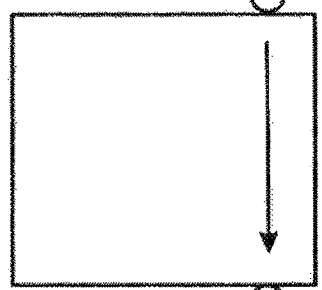
Figure 3e
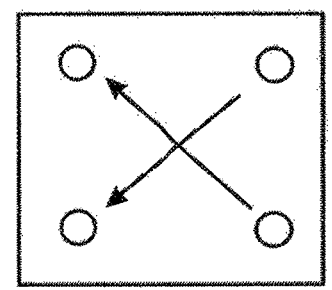
Figure 3f
Figure 4
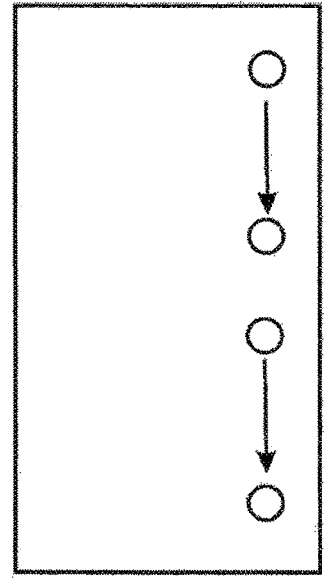

PLASMA SOURCE

The present invention relates to a plasma generating device for generating plasma as well as to a method for generating plasma in a vacuum coating facility, for example for the purpose of plasma etching, heating, nitrating and separating of layers by means of PE-CVD processes.

The invention is based on a plasma source operating based on the principle of thermal electron emission and applying a negative voltage to a heated emitter (schottky effect) or based on the principle of a hollow cathode plasma source. According to the invention, in the plasma generating device, the anode comprises an electrically delimited cavity mounted to a vacuum recipient in a scrolled manner. This cavity is closed upon deactivation of said plasma by means of a shutter mechanism, avoiding contamination due to subsequent process steps. Preferably, activation of the plasma source is ensured by means of shunts.

The invention is exemplified in detail having regard to the figures.

Figure 2:
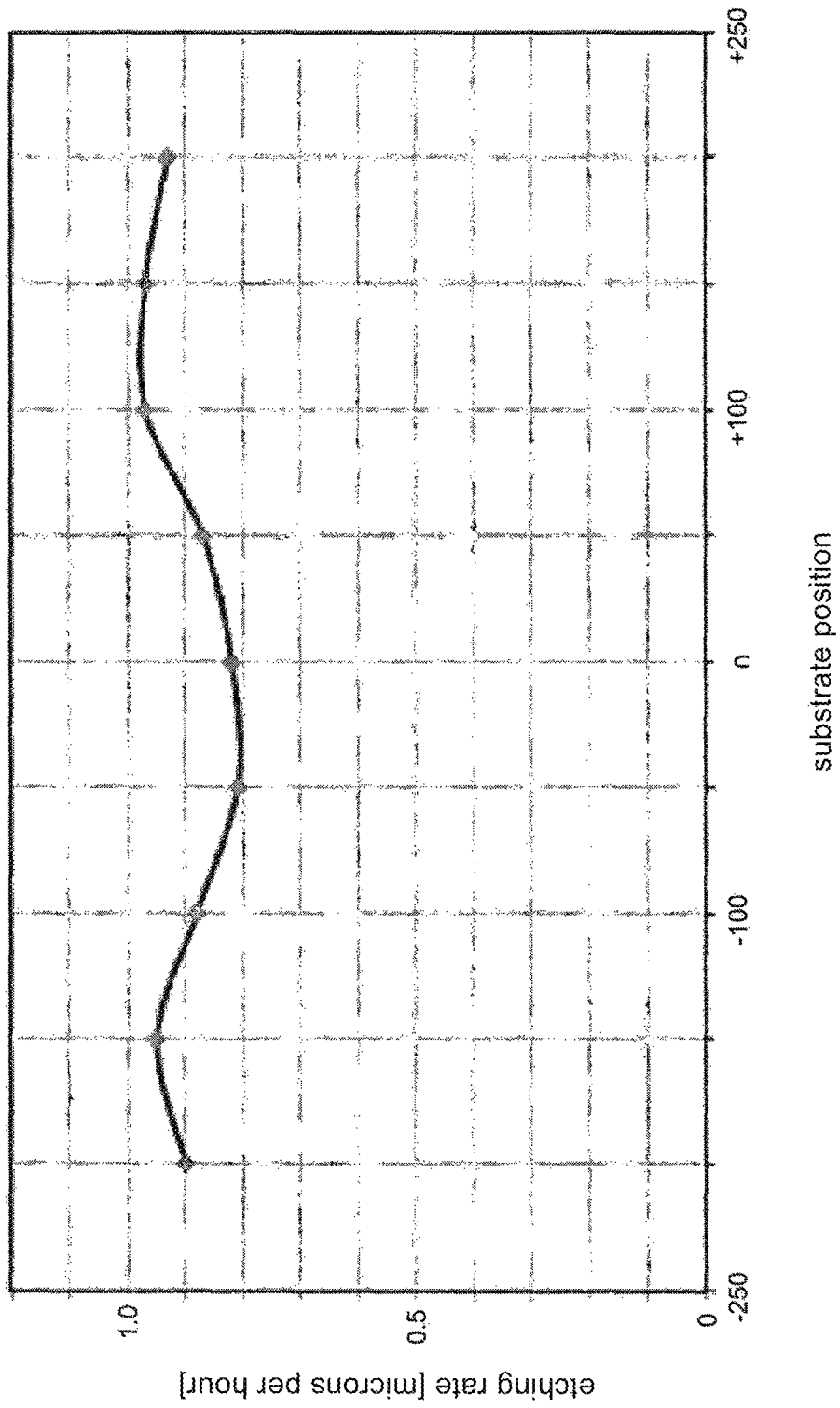
Figure 5:
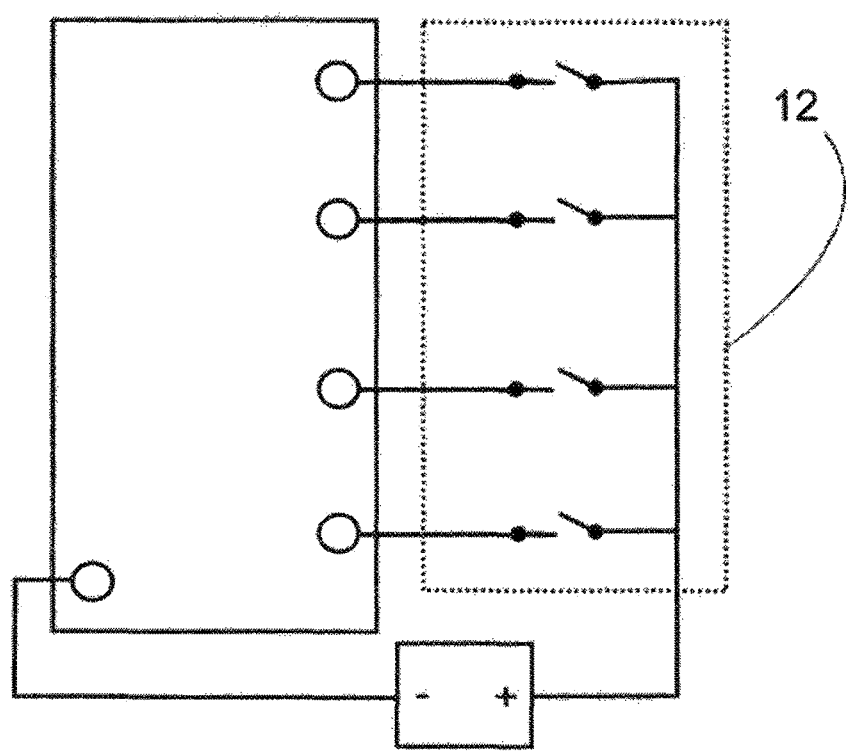

In the drawings is shown:

FIG. 1: shows a plasma generating device comprising a plasma source, a hollow anode and ignition aids;

FIG. 2: shows a representation of an etching distribution: etching rate in relation to the substrate position;

FIGS. 3a-3f: show modifications of the arrangement of the plasma source and hollow anode;

FIG. 4: shows an arrangement of the plasma source and hollow anode in facilities having larger loading height;

FIG. 5: shows a plurality of anode hollow bodies and a switching unit; and

Figure 6A:
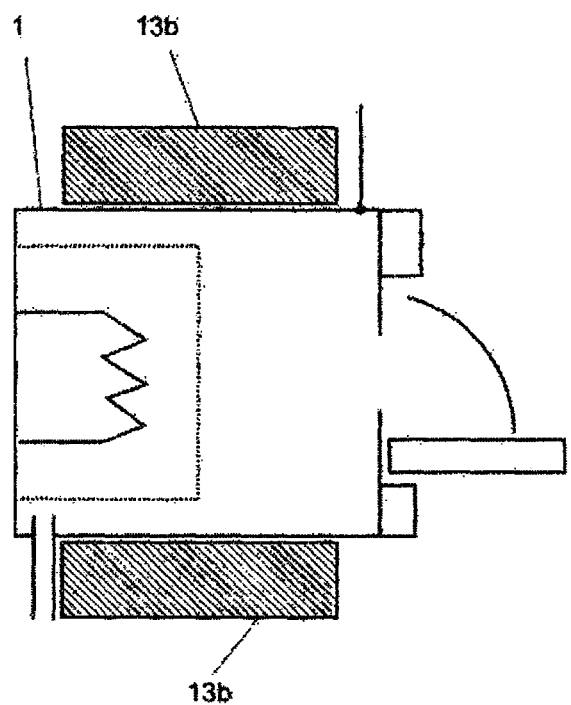
Figure 6B:
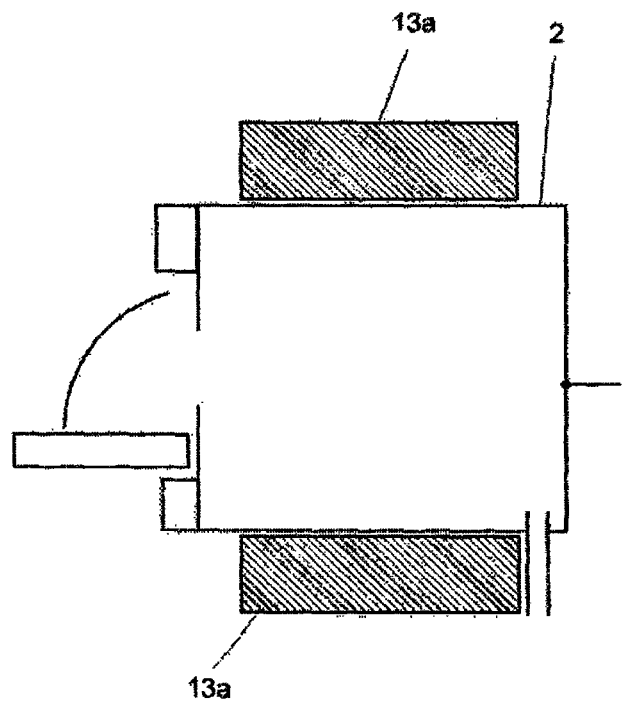

FIGS. 6a-6b: show a plasma hollow body and an anode hollow body, respectively, each having a magnetic field generation apparatus.

FIG. 1 shows an inventive plasma generating device for the treatment of workpieces, for example prior or during coating in a vacuum facility. Shown is a vacuum chamber 3 comprising a plasma source hollow body 1 being part of a plasma source, wherein the plasma source hollow body 1 is flange mounted in an electrically insulated manner via insulators. The plasma source further comprises an electron emission unit 5 which is used to produce free electrons. These means protrude into the plasma source hollow body 1, such that the electrons are generated into the plasma source hollow body 1. For example, a tungsten filament heated to a temperature of about 2700-3000K can be used as electron emission unit 5. Application of a negative voltage to the electron emission unit 5 by means of a voltage source 8 results to the creation of an electron emitter. Gas is introduced into the plasma source hollow body 1 via a gas inlet 7a. The gas is ionized by means of free electrons produced by means of the electron emission unit 5. The gas can comprise argon, for example.

The positive pole of the voltage source 8 is electrically connected to the plasma source hollow body 1 by means of a plasma source shunt (PSsR). A current can flow through said shunt 6a upon activation of the voltage source, realizing feeding of energy into the plasma in the plasma source hollow body 1. The resulting plasma in the plasma source hollow body 1 extends through a plasma source opening 10 provided in the plasma source hollow body 1 into the space of the vacuum chamber 3 and fills said space.

Further, an additional hollow body is flange-mounted, electrically insulated, to the vacuum chamber 3 via insulators 4, wherein the additional hollow body is referred to as anode hollow body 2 in the following. The vacuum chamber 3 and the anode hollow body 2 are connected to each other via an anode opening 11. The anode hollow body 2 is directly electrically connected to the positive pole of the voltage source 8. The anode hollow body 2 is provided with a gas inlet 7b through which gas is introduced into the anode hollow body 2. This gas can be argon, for example.

Further, the wall of the vacuum chamber 3 is connected to the voltage source 8 via a second shunt 6b. Therefore, flow of a discharge current from the electron emission unit 5 to the chamber wall is accomplished. Since the anode hollow body 2 is directly connected to the positive pole of the voltage source 8, a discharge occurs through the anode hollow body 2 and plasma is built-up into the anode hollow body. Hence, a path which is high-current qualified is closed, which can receive a very high discharge current at lower voltages. The current can be some 100 amperes at a voltage of about 16V to 100V.

The characteristics of the plasma which is generated in this way, largely depend on the plasma source opening 10 and the anode opening 11. The electrons are accelerated along said openings due to a potential drop, and further a very strong ionization thereof occurs in front of as well as inside the openings due to the presence of argon gas atoms, for example. Advantageously, the diameter of said openings is in the range of 4 mm and 30 mm. Advantageously, the diameters are about 12 mm. The distance between the plasma source and the hollow anode is in the range of 200 to 400 mm. The distance between the openings of the substrates to be treated is in the range of 200 to 400 mm.

In the following, additional typical operation parameters are exemplified:

Gas inlet argon: 50-200 sccm into the plasma source and/or hollow anode
Discharge current: 200 A
Discharge voltage plasma source: 16V-30V
Discharge voltage hollow anode: 16-100V The power converted into the plasma source and hollow anode needs to be conveyed away by means of measures known to the person skilled in the art (not shown in FIG. 1).

The plasma generating device as mentioned above realizes performance of a stable plasma method.

Maintenance prior to each process start, which maintenance is necessary as known so far, can be eliminated by means of the inventive plasma generating device, in particular by means of protecting the anode prior to the coating by means of screens. During the etching process the screen in front of the anode opening is opened, such that plasma can be established into the hollow anode. The screen can be closed by means of a shutter in order to allow an optional subsequent coating process, for example arc evaporation or sputtering (sputter). The same relates to the opening 10 of the plasma source to the vacuum chamber.

Compared to the prior art, since the anode itself is actively operated as a plasma source, the plasma volume is raised. Advantageously, the plasma generating device can be employed for plasma etching, plasma heating and for PECVD coating, for example.

For example, argon and hydrogen can be employed for plasma heating, resulting in the generation of atomic hydrogen having high reactivity and which is suitable for the removal of organic residuals.

In the course of PE-CVD coating, argon can be used as purge gas for the plasma source as well as the hollow anode, for example. In the course of coating, if for example $C_2H_2$ and/or $CH_4$ or gas of a further monomer or polymer is introduced into the vacuum chamber, a carbon containing layer, for example a DLC layer (diamond like carbon), is deposited in the plasma and by using a negative substrate voltage. In case of the openings 10, 11 of the plasma source and the hollow anode are formed correspondingly, a supersonic flow occurs therein. This, in addition to the high energy density, prevents coating of the plasma source and/or hollow anode. Hence, corresponding inner surfaces substantially remain uncoated and hence electrically conductive, which substantially contributes to process stability.

FIGS. 3a-3f shows modifications of the arrangement of the plasma source and hollow anode, showing the inventive plasma generating device. In doing so, arrow tips always point to a hollow anode and the ends of arrows reside in the vicinity of a plasma source. The wiring corresponds to that of FIG. 1. FIG. 3a shows a simple flange-mounting to the sidewall of a vacuum chamber. FIGS. 3b, 3c, 3d, and 3f show a flange-mounting of two plasma sources and two anodes, wherein the flow directions exhibit different spatial orientations. FIG. 3e schematically illustrates flange-mounting of a plasma source to the ceiling of the vacuum chamber, and the flange mounting of a hollow anode to the bottom of the vacuum chamber. Vacuum chambers having a higher loading height allow the arrangement of two inventive plasma generation devices one over the other. This is mutatis mutandis schematically shown in FIG. 4.

Advantageously, the shunts 6a and 6b mentioned in this specification are in the range of 10 Ohm to 100 Ohm, further advantageously in the range of 20 Ohm to 50 Ohm.

Advantageously, the plasma produced on the anode body is used solely. Therefore, in a further preferred embodiment, a plurality of anode hollow bodies by at least one plasma source hollow body are electrically driven by means of simultaneously or sequentially or overlapping activation of the switches of the switching unit 12. This is depicted in FIG. 5, wherein means for igniting the discharge are omitted for the sake of simplicity.

According to a further embodiment of the present invention the discharge voltage at the anode can be increased by usage of magnetic fields. This resides to an acceleration of ions produced at the entrance opening of the anode hollow body as well as associated high-energy particles. Further, magnetic fields can be employed at the plasma source hollow body.

FIGS. 6a and 6b show a plasma hollow body and an anode hollow body having a magnetic field generation apparatus 13a and 13b.

While the magnetic field of the plasma hollow body 13b accomplishes guidance of the electrons and hence the ions into the vacuum recipient, the magnetic field 13a at the anode hollow body causes deflection of the electrons and hence increased voltage drop in front of the anode (hall effect). However, this potential accelerates ionized gas atoms and imparts increased energy thereof.

LIST OF REFERENCE SIGNS

1 Plasma source hollow body
2 Anode hollow body
3 Vacuum recipient/chamber
4 Insulators
5 Electron emission unit (for example a filament and feeding)
6a Shunt plasma source
6b Shunt anode
7a Gas inlet plasma source
7b Gas inlet anode
8 Voltage source
9a Screen in front of anode opening
9b Screen in front of plasma source opening
10 Opening of the plasma source
11 Opening of the anode
12 Switching unit
13a Magnetic field means
13b Magnetic field means

What is claimed is:

1. A plasma generating device, comprising:
a plurality of plasma sources, wherein each plasma source has a plasma source hollow body (1) and an electron emission unit (5) to emit free electrons into each plasma source hollow body (1), wherein each plasma source hollow body (1) comprises a first gas inlet (7a) and a plasma source opening (10) which forms an opening to a vacuum chamber (3),
a plurality of anodes, wherein each anode comprises an anode hollow body (2), wherein each anode hollow body (2) comprises a second gas inlet (7b) and an anode opening (11) which forms an opening to the vacuum chamber (3), and
a voltage source (8) the negative pole of which is connected to each electron emission unit (5) and the positive pole of which is connected to each anode hollow body (2),
wherein the plurality of anodes are externally mounted to the vacuum chamber (3) and the positive pole of the voltage source (8) is additionally electrically connected to each plasma source hollow body (1) by means of a first shunt (6a).

2. The plasma generating device according to claim 1, wherein the positive pole of the voltage source (8) is electrically connected to the vacuum chamber by means of a second shunt (6b).

3. The plasma generating device according to claim 1, wherein at least one plasma source opening (10) is provided with a screen (9b) which is adapted to close the at least one plasma source opening (10) as needed.

4. The plasma generating device according to claim 1, wherein at least one anode opening (11) is provided with a screen (9a) which is adapted to close the at least one anode opening (11) as needed.

5. The plasma generating device according to claim 1, wherein at least one plasma source opening and/or at least one anode opening are formed such that supersonic flow through the at least one plasma source opening is established during operation.

6. The plasma generating device according to claim 1, wherein at least one anode hollow body (2) is flange-mounted to the vacuum chamber (3).

7. The plasma generating device according to claim 1, wherein at least one anode hollow body (2) is flange-mounted to one of a sidewall, ceiling, or bottom of the vacuum chamber (3).

8. The plasma generating device according to claim 1, wherein at least one anode hollow body (2) is mounted to the vacuum chamber (3) in an electrically insulated manner via insulators (4).

9. The plasma generating device according to claim 8, wherein at least one anode hollow body (2) is flange mounted to the vacuum chamber (3).

10. The plasma generating device according to claim 1, wherein the plurality of plasma sources comprise a first plasma source and a second plasma source and the plurality of anodes comprise a first anode and a second anode, and wherein a first flow of electrons extends between the first plasma source and the first anode and a second flow of electrons extends between the second plasma source and the second anode.

11. The plasma generating device according to claim 10, wherein the first flow and the second flow are parallel.

12. The plasma generating device according to claim 11, wherein the first flow is arranged substantially above the second flow.

13. The plasma generating device according to claim 10, wherein the first flow and the second flow are perpendicular to each other.

14. The plasma generating device according to claim 1, wherein each plasma source opening (10) is provided with a screen (9b) which is adapted to close each plasma source opening (10) as needed.

15. The plasma generating device according to claim 1, wherein each anode opening (11) is provided with a screen (9a) which is adapted to close each anode opening (11) as needed.

16. The plasma generating device according to claim 1, wherein each anode hollow body (2) is flange-mounted to the vacuum chamber (3).

17. The plasma generating device according to claim 1, wherein each anode hollow body (2) is flange-mounted to one of a sidewall, ceiling, or bottom of the vacuum chamber (3).

18. The plasma generating device according to claim 1, wherein each anode hollow body (2) is mounted to the vacuum chamber (3) in an electrically insulated manner via insulators (4).

19. The plasma generating device according to claim 8, wherein each anode hollow body (2) is flange-mounted to the vacuum chamber (3).

* * * * *